Figure 1:
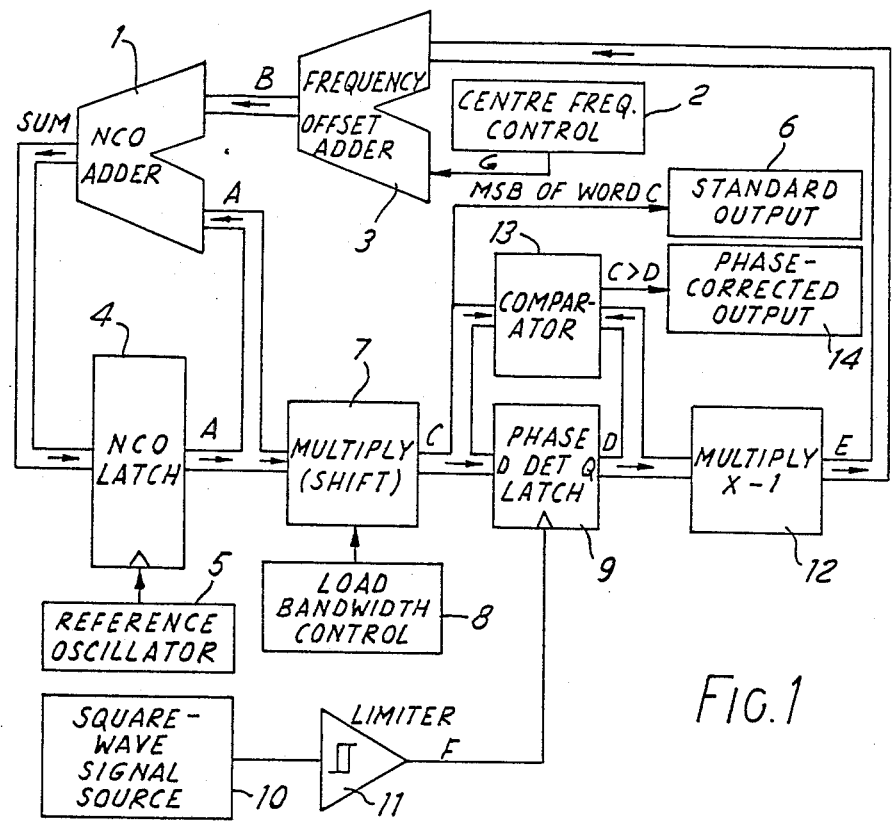

United States Patent [19]

Waltham

[11] Patent Number: 4,791,378

[45] Date of Patent: Dec. 13, 1988

[54] PHASE-LOCKED LOOPS

[75] Inventor: Richard M. Waltham, London, England

[73] Assignee: Thorn EMI plc, London, England

[21] Appl. No.: 146,426

[22] Filed: Jan. 21, 1988

[30] Foreign Application Priority Data

Jan. 24, 1987 [GB] United Kingdom ................. 8701573

[51] Int. Cl.[4] .......................... H03K 5/13; H03K 9/06; G05F 5/00
[52] U.S. Cl. .................................... 328/155; 328/156; 328/157; 328/133; 328/134; 307/511; 307/525; 307/529
[58] Field of Search ............... 328/155, 156, 157, 133, 328/134; 307/511, 523, 525, 526, 529

[56] References Cited

U.S. PATENT DOCUMENTS 4,577,163  3/1986  Culp .................................. 331/1 A Primary Examiner—John S. Heyman
Assistant Examiner—Trong Quang Phan
Attorney, Agent, or Firm—Fleit, Jacobson, Cohn & Price

[57] ABSTRACT

A digital phase-locked loop using a binary overflowing accumulator as a numerically controlled oscillator has external compensation to eliminate frequency-dependent phase offset problems while not requiring any second-order filtering.

Operation of the NCO adder initiates with value set by the center frequency control and under the latching action of the latch clocked by the reference oscillator produces a linearly stepped output. Detection of the most-significant bit values produces a square wave at the output. The phase detector latch is used for phase correction, while comparator eliminates steady-state phase error.

3 Claims, 1 Drawing Sheet

PHASE-LOCKED LOOPS

The present invention relates to circuitry incorporating phase-locked loops.

A phase-locked loop is often susceptible to steady-state phase errors due to centre frequency offset. In an attempt to overcome such errors, the phase-locked loop may have a second-order loop filter to provide close tracking of the output to the input. However a second-order filter can add considerable complexity to the hardware necessary, thereby making the equipment more expensive.

U.S. Pat. No. 4,577,163 discloses a digital phase-locked loop which uses, as a numerically controlled oscillator, a binary adder. The carry output of the adder is sampled and the result fed back to the phase comparator via a frequency divider. A counter is incremented or decremented according to the state of the comparator output and the contents of the counter provides a second input to the adder.

An object of the present invention is to reduce or eliminate the phase errors in first-order phase-locked loops without requiring a second-order filter.

The present invention provides circuitry comprising a phase-locked loop having accumulator means with adding means to effect summation of two input signals and with latch means whose input is connected to receive the summed output of the adding means, the latch means being clocked by reference-oscillator means, the output of the latch means being connected to an input of the adding means such that the output signal from the latch means constitutes one of the two input signals to the adding means, means to detect a change of value of the most-significant bit of the output of the latch means, means to generate an output in accordance with the output of the detection means and means to sample the output signal from the latch for derivation of a phase-correction.

In this way, there may be provided phase-locked loop circuitry using an accumulator as a numerically controlled oscillator to produce an output signal with a frequency determined by that input signal to the adding means not constituted by the output signal from the latch means.

Preferably, the circuitry includes phase-detection means comprising means to sample the output signal from the latch means, means to effect operation of the sampling means in accordance with a transition of an input wave, and means to determine any difference in phase.

Preferably, the output of the phase detection circuitry is arithmetically transformed and the resulting signal is connected to the control input of the numerically controlled oscillator, providing negative feedback around the phase-locked loop.

Preferably, the circuitry comprises means to compare the input and output of a phase-correction means, thereby to track the input waveform more accurately than a normal PLL.

Thus, as distinct from U.S. Pat. No. 4,577,163, in the present invention the output of the adder is sampled at regular intervals by the input signal to produce a number representing the magnitude as well as the sense of the phase error, and this number or its derivative is applied to the second input of the adder to provide correction. In this way, the present invention can effect second order correction by comparing the latched correction with the input to the latch.

The present invention also embodies an integrated circuit which incorporates the features hereinabove defined.

Figure 2:
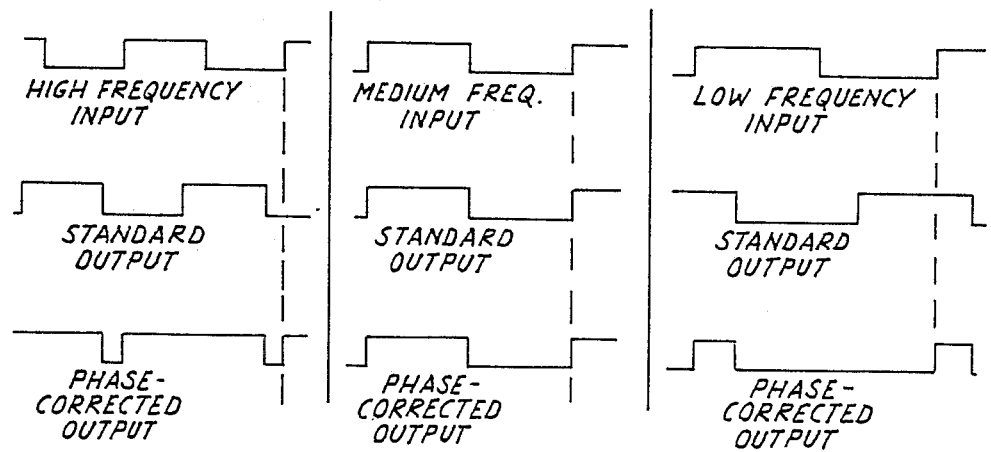

In order that the invention may more readily be understood, a description is now given, by way of example only, reference being made to the accompanying drawings, in which:

FIG. 1 is a block schematic diagram of a circuit embodying the present invention; and FIG. 2 is a representation of the waveforms in the circuit of FIG. 1.

The circuit shown in FIG. 1 consists of a digital phase-locked loop using a binary overflowing accumulator as a numerically controlled oscillator. The circuit provides elimination of frequency-dependent phase offset problems without requiring any second-order filtering, this being achieved by incorporating external compensation.

Thus, assuming that numerically controlled oscillator adder 1 initially contains a binary signal with all digits "0", the application of the central frequency control word, G, from the central frequency control unit 2, via frequency offset adder 3 with no signal at its other input, produces a sum output which is also G. The output, A, from NCO latch 4 remains zero until the next clock pulse from reference oscillator 5 latches the sum. At this stage, the latch output then changes to a value of G and is fed back to NCO adder 1 to produce a new output with value 2G. This is latched on the next clock pulse to produce a new latch output of value 2G. This again is fed back to adder 1 to be added to input word G. The latch output therefore increases linearly in steps of value G until the contents of the adder 1 exceed the maximum (i.e. all "1") whereupon adder 1 resets to a remainder value close to zero and the cycle begins again. The cycle duration is therefore determined by input word G; halfway through the cycle the most significant bit of the latch changes from "0" to "1", and at the end of the cycle from "1" to "0". By detecting the most-significant bit, a square wave is produced at standard output 6 having equal mark and space with a frequency determined by B. Multiplier 7 which is controlled by loop bandwidth control unit 8 operates to adjust the loop gain and bandwidth, this multiplication preferably being implemented as a shift.

A phase detector latch 9 samples the output value of multiplier 7 in response to a transition in the input square wave after output by signal source 10 and passage through limiter 11. If the two signals are not in phase, the number latched is non-zero and the output of latch 9, D, indicates the magnitude and sign of the correction needed to correct the phase error. To achieve this correction, the value of B is changed by processing unit 12, to produce a signal E to generate negative feedback, and applying signal E to frequency offset adder 3. Frequency offset adder 3 allows the centre frequency of the operation of the phase locked loop to be adjusted at will.

The circuit described above is a type of first order PLL. A well know property of such systems is that there is a steady state phase error which varies as a function of the frequency difference between the input signal (F) and the centre frequency of the PLL. In order to substantially eliminate this steady state phase error, additional phase correction is provided by comparator 13, which compares the input and the output of the phase detector latch 9 and accurately tracks the positive-going transitions of the input waveform. Supposing the input of latch 9 is increasing from zero to the maximum "N" and the input from source 10 occurs when the input is M, the latch output is then also M; but since the input continues to increase, the input is greater than the output and the phase-correction output 14 remains high until the input exceeds N and becomes zero. Since the latch still contains M, the input is now less than the output and the output goes low and remains low until the input exceeds M, or whatever new number has been latched. The phase-corrected output 14 has the same frequency as the standard output 6, but its transitions are synchronised to those of the reference square wave.

The phase detector based on latching the output of the numerically controlled oscillator can resolve arbitrarily small phase angles, and can produce an output which is linearly proportional to the phase error over a range of 360°.

FIG. 2 provides comparisons of the standard and phase-compensated outputs for three input frequencies. As shown by the broken lines, transitions of the phase-corrected outputs track the input phase accurately, as distinct from the tracking achieved by the standard outputs.

The present invention is particularly suited for use in FSK modulation and demodulation e.g. in systems for signalling on electrical mains wiring. The present invention is also applicable to digital television receivers e.g. for locking with zero phase error to the line frequency or colour sub carrier.

What is claimed is:

1. Circuitry comprising a phase-locked loop having accumulator means with adding means to effect summation of two input signals and with latch means whose input is connected to receive the summed output of the adding means, the latch means being clocked by reference-oscillator means, the output of the latch means being connected to an input of the adding means such that the output signal from the latch means constitutes one of the two input signals to the adding means, means to detect a change of value of the most-significant bit of the output of the latch means, means to generate an output in accordance with the output of the detection means and means to sample the output signal from the latch for derivation of a phase-correction.

2. Circuitry according to claim 1 comprising phase-detection means with means to sample the output signal from the latch means, means to effect operation of the sampling means in accordance with a transition of a reference square wave, and means to determine any difference in phase.

3. Circuitry according to claim 1, comprising means to compare the input and output of a phase-detection means, and means to effect tracking of the input waveform.

* * * * *